(12) United States Patent
Ben-Bassat

(10) Patent No.: US 7,595,698 B2
(45) Date of Patent: Sep. 29, 2009

(54) PLL LOCK TIME REDUCTION

(75) Inventor: Assaf Ben-Bassat, Haifa (IL)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 11/899,240

(22) Filed: Sep. 5, 2007

(65) Prior Publication Data

US 2009/0058537 A1 Mar. 5, 2009

(51) Int. Cl.
*H03L 7/085* (2006.01)
*H03L 7/089* (2006.01)
*H03L 7/095* (2006.01)

(52) U.S. Cl. .................. 331/17; 331/25; 331/DIG. 2

(58) Field of Classification Search ............... 331/1 A, 331/8, 16–18, 25, DIG. 2
See application file for complete search history.

(56) References Cited

U.S. PATENT DOCUMENTS

2005/0280475 A1* 12/2005 Hanselmann ............... 331/16

* cited by examiner

*Primary Examiner*—David Mis
(74) *Attorney, Agent, or Firm*—Ryder IP Law; Douglas J. Ryder

(57) ABSTRACT

In general, in one aspect, the disclosure describes a method including determining a change in a lock state of a phase lock loop (PLL). Current provided to a charge pump (CP) is adjusted based on the change in the lock state of the PLL. The adjusting of the current is synchronized to occur during an idle state of the CP.

10 Claims, 3 Drawing Sheets

PLL LOCK TIME REDUCTION

BACKGROUND

The phase-locked loop (PLL) is a circuit that generates a clock at a controlled frequency. The PLL is used in a wide variety of applications, including frequency synthesis, clock recovery, clock multiplication, and clock regeneration. FIG. 1 illustrates an example block diagram of a PLL 100. The PLL 100 includes a phase-frequency detector (PFD) 110, a charge pump (CP) 120, a filter (e.g., low pass filter (LPF)) 130, and an oscillator 140. The output frequency of the oscillator 140 is controlled by one or more input control signals. In operation, the PLL 100 adjusts the frequency of the oscillator 140 to match (in both frequency and phase) a reference input 160 by periodically charging or discharging the LPF 130 using the CP 120 based on input from the PFD 110. Once matched, the output (controlled clock signal) 165 of the PLL 100 is locked at the frequency of the reference clock 160. The PLL 100 may also include a divider 150 on a feedback loop from the oscillator 140 to the PFD 110. The divider 150 takes the PLL output 165 and divides it by N so that the divided signal 170 is compared to the reference input. This enables the PLL output 165 to be N times higher in frequency than the reference input 160, allowing the PLL 100 to perform frequency multiplication.

Lock time is the time it takes the PLL 100 to generate the controlled clock signal 165 at the desired frequency by locking onto the reference frequency. Decreasing lock time is usually desirable 100. One way to decrease lock time is by increasing the loop bandwidth. However, increasing loop bandwidth may affect the performance of the PLL after lock.

BRIEF DESCRIPTION OF THE DRAWINGS

The features and advantages of the various embodiments will become apparent from the following detailed description in which.

DETAILED DESCRIPTION

Dynamically increasing the loop bandwidth of the oscillator 140 during lock acquisition and decreasing the loop bandwidth after lock is one way to increase the lock speed without affecting the performance of the PLL 100 after lock. One way to dynamically control the loop bandwidth of the PLL 100 is by changing the gain (e.g., current) of the CP 120 where increasing the gain increases loop bandwidth and vice versa. Changing the current setting of the CP 120 during operation may cause a voltage disturbance. If the current change occurs during charging or discharging operations of the CP 120, the voltage disturbance may be significant enough to directly affect the PLL output frequency. For PLLs with relatively small lock times (e.g., $\leq 10$ uSec) the time needed to recover from a significant voltage disturbance and resultant frequency disturbance may be greater then any reduction in lock time gained by increasing the gain of the CP 120 (and loop bandwidth of the PLL 100) during lock acquisition.

To reduce the voltage disturbance and resultant frequency disturbance caused by changing the current of the CP 120, the change in current of the CP 120 may be synchronized with the charging state (e.g., charging, discharging, idle) of the CP 120. If the current changes to the CP 120 occur during idle charging periods of the CP 120 the voltage disturbance is significantly reduced. In addition, synchronizing the current changes of the CP 120 to the idle periods of the CP 120 ensures the voltage disturbance caused thereby will be consistent each time such a current change is required.

Figure 1:
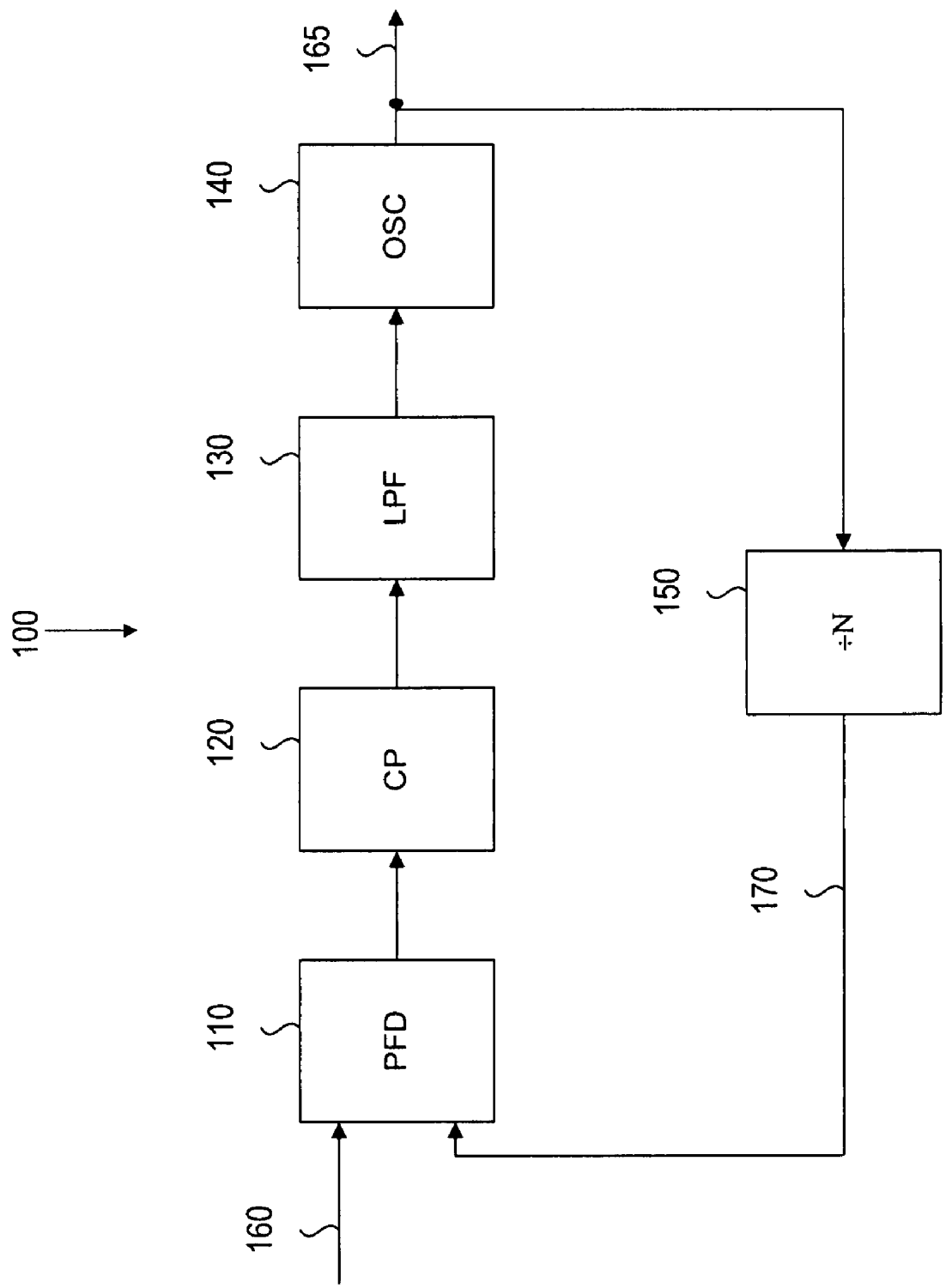
FIG. 1 illustrates an example block diagram of a PLL, according to one embodiment.
Figure 2:
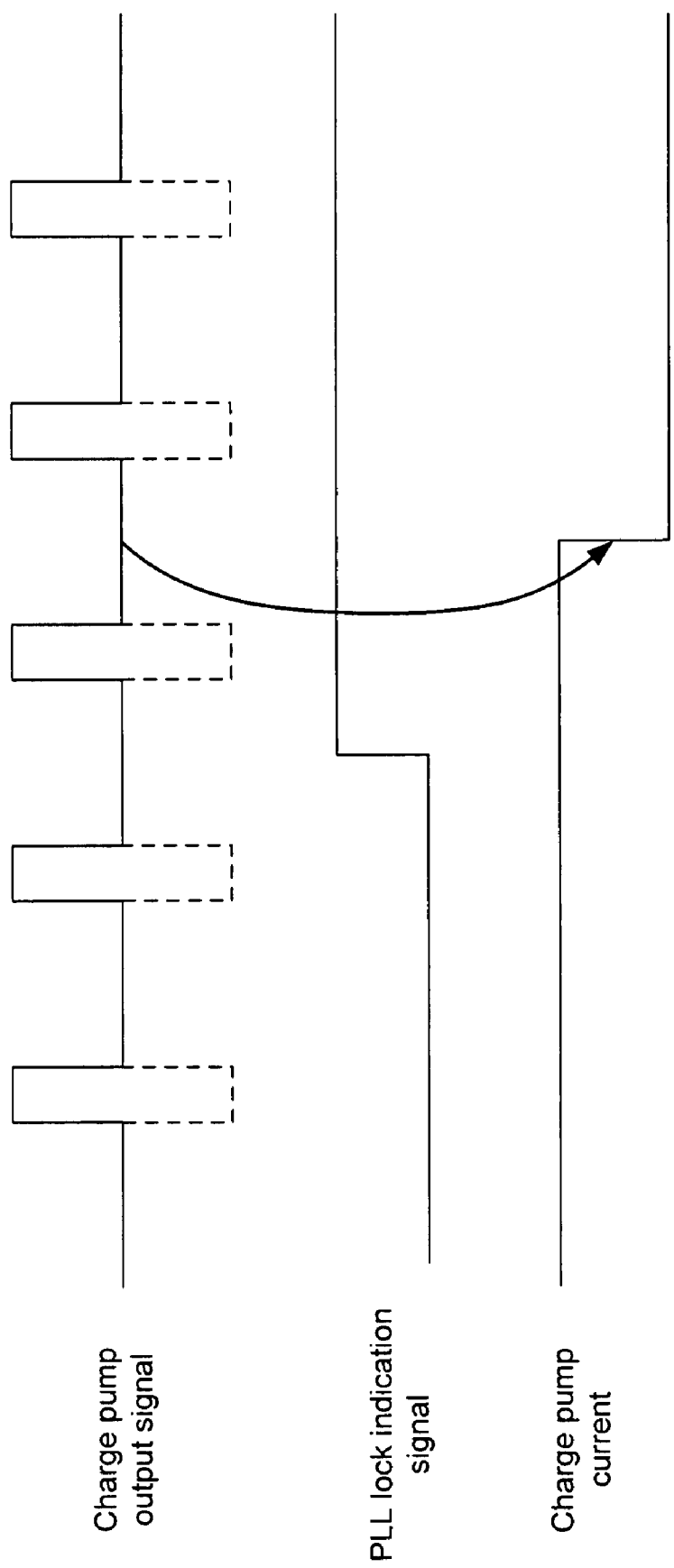
FIG. 2 illustrates a timing diagram showing an example synchronization of current changes to the CP with idle charge periods in the CP, according to one embodiment.

FIG. 2 illustrates a timing diagram showing an example synchronization of current changes to the CP with idle charge periods in the CP. The CP output signal includes active periods where the CP either charges or discharges in order to increase or decrease the frequency of the oscillator and idle periods. For each active period the CP output signal illustrates both of the possible states (charging and discharging) even though the CP will only be charging or discharging during any given active period. The PLL lock indication signal indicates when the PLL is locked. The PLL lock indication signal may be activated (e.g., set to 1) when it is determined that the oscillator has locked onto the incoming signal. As illustrated, the PLL became locked after the second active period of the CP. The CP current may be high (to provide higher gain) during lock acquisition and low (to proved lower gain) after lock. The transition from the high current to the low current is synchronized so that it occurs during an idle period in the CP. As illustrated, the current is reduced from high to low in the inactive period after lock occurs.

Figure 3:
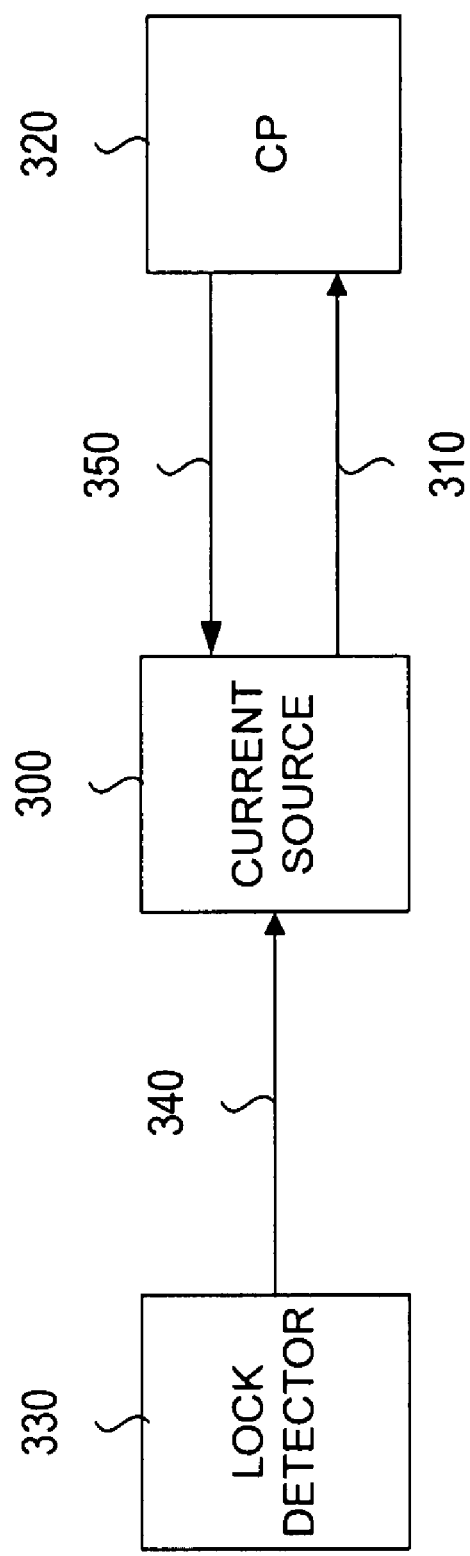
FIG. 3 illustrates a block diagram of an example configuration of components of a PLL involved in synchronizing the current change with idle charging periods, according to one embodiment.

FIG. 3 illustrates a block diagram of an example configuration of components of a PLL involved in synchronizing the current change with idle charging periods. A current source 300 may provide the current 310 utilized to control the gain of the CP 320. The current 310 provided is based on the state of the PLL (e.g., lock acquisition, locked). A lock detector 330 may inform the current source 300 of the lock state with the lock indication signal 340. The CP 320 may inform the current source 300 of the charging state of the CP 320 with the CP output signal 350. When the PLL enters a lock state (e.g., lock indication signal 340 is active) the current source 300 may reduce the current 310 provided to the CP 320 when the charging state of the CP 320 is idle (e.g., CP output signal 350 indicates no charging/discharging).

The current source 300 may reduce the current 310 as soon as the lock indication signal 340 indicates the PLL is locked if the CP output signal 350 indicates the CP 320 is idle. However, if the lock occurs just prior to the CP 320 entering an active (charging/discharging) period this may result in the current being reduced during an active period. In order to ensure the current change occurs during an idle period the current source 300 may wait to change the current 310 until it detects the start of an idle period (end of active period). The current source 300 may utilize counters (to count changes in the CP state) or timers to defer the detection of an idle state to ensure the beginning of an idle state is detected and there is sufficient time to change the current 310 during this period. Any number of mechanisms can be utilized for synchronization without departing from the current scope.

The synchronization has been discussed with reference to reducing the current applied to the CP once lock has occurred but could also be applied to increasing the current if lock is lost and needs to be reacquired.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. A method comprising
   determining a change in a lock state of a phase lock loop (PLL);
   adjusting current provided by a current source based on the change in the lock state of the PLL; and
   providing the adjusted current to a charge pump (CP), wherein the adjusting is synchronized to occur during an idle state of the CP.

2. The method of claim 1, wherein the adjusting includes adjusting the current downward when the lock state of the PLL changes to locked.

3. The method of claim 1, wherein the adjusting includes adjusting the current upward when the lock state of the PLL changes to acquiring lock.

4. The method of claim 1, wherein the adjusting includes determining start of an idle state subsequent to determining the change in lock state.

5. An apparatus comprising
   an oscillator to generate a signal at a controlled frequency, wherein the controlled frequency is based on a reference signal, wherein the oscillator is to lock an operating frequency of the oscillator as the control frequency when it aligns with frequency of the reference signal;
   a current source to provide an output current based on lock state of the oscillator, wherein the output current is a first value during a lock acquisition state and a second value during a lock state, wherein the current source is to adjust the output current value when the lock state changes; and
   a charge pump (CP) to charge or discharge the oscillator to increase or decrease the operating frequency toward the frequency of t the reference signal, wherein the charging or discharging is done in cycles separated by idle periods, wherein the CP is to receive the output current, wherein the current source is to synchronize adjustment of the output current value with the idle periods of the CP.

6. The apparatus of claim 5, wherein the current source is to adjust the output current downward when the lock state changes to locked.

7. The apparatus of claim 5, wherein the current source is to adjust the output current upward when the lock state changes to acquiring lock.

8. The apparatus of claim 5, wherein the current source is to determine start of an idle state subsequent to change in lock state.

9. The apparatus of claim 5, further comprising a phase-frequency detector to compare the reference signal to the operating frequency of the oscillator.

10. The apparatus of claim 9, further comprising a divider to divide the operating frequency of the oscillator, wherein the phase-frequency detector is to compare the reference signal to the divided operating frequency.

* * * * *